April 15, 1952 G. C. SZIKLAI 2,593,361

WIDE RANGE HIGH-FREQUENCY SERIES-RESONANT TUNING CIRCUIT

Filed Dec. 30, 1948

INVENTOR
George C. Sziklai
BY
J. L. Whittaker
ATTORNEY

Patented Apr. 15, 1952

2,593,361

UNITED STATES PATENT OFFICE 2,593,361

WIDE RANGE HIGH-FREQUENCY SERIES-RESONANT TUNING CIRCUIT

George C. Sziklai, Princeton, N. J., assignor to Radio Corporation of America, a corporation of Delaware Application December 30, 1948, Serial No. 68,233

5 Claims. (Cl. 178—44)

The present invention relates to ultra-high-frequency tuning apparatus.

Ultra-high-frequency tuning apparatus is known, for example the so-called "butterfly" tuning device, which provide a wide frequency range of tuning. This apparatus has the advantage of maintaining a substantially constant L to C ratio over the range of frequencies through which it is tuned. It has, however, one important deficiency, namely, that it is not suitable for series-resonant tuning. Consequently, certain trap circuits utilizing series-resonant tuning are difficult to construct for practical and easy operation where a wide tuning range is desired. Also, certain phase shift units, which are known theoretically, can be constructed and operated only with difficulty and "butterfly" tuning devices cannot be used in them. Thus, for example, in television transmission or pulse or phase modulation transmission, a phase shift equalizer is highly useful, since the various filters usually introduce a non-uniform time delay at different frequencies. In theory, networks are known which provide a 180 degree phase shift at a critical frequency. The use of these usually precludes tuning, because when tuned, the image impedance of the network changes. Consequently, undesired reflections may be introduced in the transmission line leading to the antenna, where these phase shift correction networks are usually placed in transmitting apparatus. Lattice networks are known in theory which may be tuned to different frequencies, which provide the desired phase shift, and the image impedance of which remains unchanged throughout the tuning range. These lattice networks are not used in practice because no tuning apparatus has been known whereby the elements of the lattice may be tuned simultaneously to change the frequency and at the same time maintain a constant L to C ratio which is a prerequisite for giving the desired phase correction without any change in image impedance.

It is an object of the present invention to provide ultra-high-frequency tuning apparatus which may be series tuned.

It is another object of the invention to provide ultra-high-frequency tuning apparatus which may be tuned over a broad range of frequencies to provide a 180 degree phase shift at the critical tuned frequency with a constant image impedance.

It is another object of the invention to provide an ultra-high-frequency tuning unit which may be used in series tuned circuits.

Another object of the invention is to provide an improved ultra-high-frequency series tuning unit adjustable over a wide band of frequencies with a substantially constant L to C ratio.

These and other objects, advantages and novel features of the invention will become more apparent from the following description when taken in connection with the accompanying drawing in which like parts bear like reference numerals and in which.

Figures 1, 2, 3, 4, 5, 6, 7, 8, 9, 10, 11, 12:
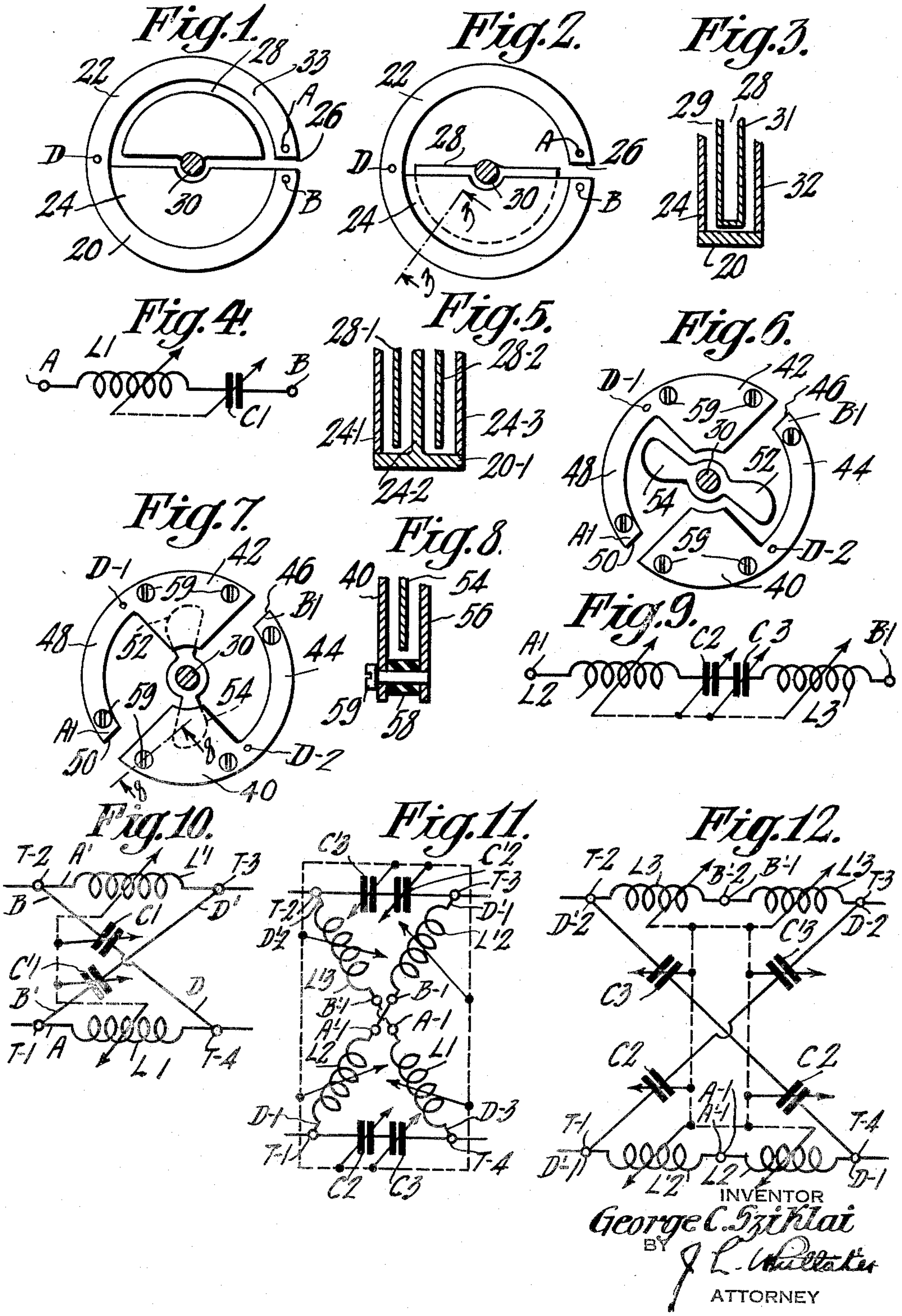
Figure 1 is a face view of a series tuned unit of the invention having a rotor in the position of minimum capacity and minimum inductance.
Figure 2 is a face view of the unit of Figure 1 showing the rotor in the position of maximum inductance and maximum capacity.
Figure 3 is a cross-sectional view of the unit of Figure 2 taken along the lines 3, 3 of Figure 2.
Figure 4 is a circuit diagram schematically illustrating the equivalent circuit of the device of Figures 1 and 2.
Figure 5 is a partial cross-sectional view of an alternative construction of the device of Figures 1 and 2.
Figure 6 is a face view of another embodiment of the invention avoiding wiping contacts and adapted to be tuned over a higher range of frequencies than a device of similar size constructed similarly to that of Figure 1.
Figure 7 is a face view of the device of Figure 6 having the rotor in a position of maximum inductance and capacity.
Figure 8 is a cross-sectional view of the device of Figure 7 taken along the lines 8, 8 of Figure 7.
Figure 9 is a circuit diagram schematically illustrating an equivalent circuit of the device of Figures 6 and 7.

Figure 10 is a circuit diagram schematically illustrating one type of lattice network which may be constructed utilizing two devices similar to that of Figures 1 and 2; and Figures 11 and 12 are circuit diagrams schematically illustrating other lattice networks of constant image impedance which may be constructed using devices similar to that of Figures 6 and 7.

In accordance with the invention, I provide an ultra-high-frequency tuning unit having a condenser stator, an inductive conductor having one end directly connected to the stator periphery and having one end free, and a movable metallic element having a portion which may be positioned either in capacitive relation to the condenser stator or in inductive relation to the inductive conductor or in positions intermediate thereto. In one form of the unit, the condenser stator is of generally semi-circular sectorial shape and the inductor is of the shape of a substantially semi-circular annulus having one end directly connected to the stator as a continuation of the outer periphery thereof, and a semi-circular rotor plate. Thus the outer periphery of the stator and annular conductor taken together form a nearly complete circle with the rotor of the unit rotating about the axis of the circle but in a plane spaced from and parallel to the plane of the circle. In another form of the invention, I provide a unit comprising a pair of generally quadrantal stators occupying opposed quadrants of a circle and a pair of quadrant annular conductors each being directly connected to and extending from the circular periphery respectively of one of the pair of quadrantal plates and having the other end spaced from the other quadrantal plate and free, and a rotor having an opposed generally quadrantal pair of vanes spaced from the plates and inductors and rotating in a different plane about the axis of the said circle in which they lie. Further in accordance with the invention, I provide a lattice network unit of the type employing series reactors of one sign in the parallel lines of a two-wire transmission line and shunt reactors of another sign between the transmission line wires to derive a lattice network unit which may be tuned over a broad range of frequencies without alteration of the image impedance of the network.

Referring now more particularly to Figure 1, there is shown in face view a tuning unit of the invention comprising an annular band 20, a portion 22 of which may be considered as an extension of a semi-circular stator plate 24. The inductor 22 is connected to plate 24 at an outer peripheral edge thereof and extends in a nearly complete semi-circle, one end 26, however, being free. A second semi-circular rotor plate 28 is carried on a rotor shaft 30 having its axis of rotation coincident with the axis of the circle of the semi-circular plate 24. Figure 2 shows the same element with the plate 28 in a position of maximum capacity of the element with stator plate 24. A second plate 32 may, if desired, lie behind the plate 24 as appears more clearly from the cross-sectional view of Figure 3 and having the same shape as the plate 24. The semi-circular plates 24 and 32 may be supported by the annular member 20. The annular extension 22 having a free end 26 may have the same axial depth as member 20 or it may only have the axial depth of plate 24, or it may be merely a thin wire, but preferably self-supporting. However, it may be insulatingly supported with respect to the other members by supports (not shown). The plate 28 may have faces 29 and 31, as outer portions of a hollow structure, it being apparent that only the outer metallic surfaces are active in the structure.

In operation, I may connect the device between two terminals of a multi-terminal network. Terminal A at the free end 26 of annular inductor 22 may be connected to one network terminal, and the other network terminal may be connected to rotor plate 28 by connecting to the rotor as indicated by B. It will now be apparent that the equivalent circuit as illustrated schematically in Figure 4 is a series tuned circuit in which the inductance of inductor 22 and the capacity between rotor and stator plates 28 and 24 correspond in a qualitative manner to the inductance L1 and capacity C1 respectively of Figure 4. In fact, the magnetic and electric fields are complicated and will not be further analyzed. It should be noted, however, that the plate 28 in its position of maximum inductance as shown in Figure 1 substantially entirely intercepts the magnetic lines of force around inductor 22 (which position of rotor 28 may be characterized as placing it in inductive relation to inductor 22), and has substantially no capacity with the semi-circular stator plate 24. However, when the rotor plate 28 is in the position shown in Figure 2, the rotor plate is substantially entirely free of the magnetic field around inductor 22 and has maximum capacity with plate 24. It will also be apparent in a qualitative way that the ratio of L1 to C1 as the semi-circular plate is rotated will remain substantially constant, since any areas of the rotor plate 28 removed from the magnetic field enters into capacitive relation to the stator plate 24 and is withdrawn from its inductive relation to inductor 22 and vice versa. In any event, it is found in actual experience that the ratios L1 to C1 with various positions of the rotor plate 28 remain sufficiently constant for practical purposes with the connections shown. If inductor 22 has its dimensions decreased as suggested hereinbefore, the inductance L1 is increased. The tuned frequency is then over a lower frequency range. Again, the inductance L1 may be descreased by connecting to a point 33 closer to the point D of junction between stator plate 24 and inductor 22. The tuned frequency of the circuit of Fig. 4 is thereby increased. Referring now more particularly to Figure 5, there is shown in cross-sectional view a device the face view of which is similar to that of Figure 3 except that two rotor semi-circular plates 28—1 and 28—2 are used and three stator semi-circular stator plates 24—1, 24—2 and 24—3 with which the rotor plates 28—1 and 28—2 interleave. As before, the stator plates may be supported and connected to annular member 20—1. The stators are connected together in effect at similar points by screws 59. If desired, only one inductor 48 may be used to vary the inductance thus decreasing the frequency range and increasing the operating frequency.

Referring now more particularly to Figure 6, generally quadrantal plates 40 and 42 lie in opposed quadrants of a circle. From one outer periphery of quadrantal stator plate 40 extends an inductor 44 of quadrantal annular shape but having a free end 46. From the corresponding outer peripheral edge of quadrant stator 42, that is, the outer peripheral edge proceeding counter-clockwise, extends a similar quadrantal annular inductor 48 having a free end 50. The outer peripheral edge of the plates and inductors lie substantially on a circle. A rotor member having two opposed substantially quadrantal vanes 52 and 54 lying in substantially the same plane has its axis of rotation on the axis of the said circle but is insulatingly spaced from the stator plates 40, 42 and inductors 44, 48. Figure 7 illustrates the same device with the rotor vanes rotated to a position of maximum capacity and inductance, whereas the view of Figure 6 shows the rotor plates in a position of minimum capacity and inductance. This device may be connected between the two terminals of a multi-terminal network by connecting the ends 50 and 46 as terminals A-1 and B-1 respectively. The rotor vanes may be cut, as shown, for "straight line frequency" operation, if desired.

In operation, following the current in its passage through the device from terminal A–1, one may qualitatively construct the roughly equivalent circuit illustrated schematically in Figure 9. The inductance of inductor 48 is L2, the capacity between stator plate 42 and rotor plate 52 may be the capacity C2. The capacity from rotor plate 54 to stator plate 40 may be the capacity C3 and the inductance of inductor 44 to terminal B1 may be the inductance L3. It will be apparent that this provides a series tuned circuit, and may be used whenever such a circuit is desired. The element may be constructed with the metallic parts 40 and 44 insulatingly supported and spaced from the metallic parts 42 and 48, which may be merely thin pieces of metal, and the rotor with its vanes 52 and 54 may be supported on bearings substantially outside the electric and magnetic fields generated in the operation of the device. One outstanding advantage of the device of Figures 6 and 7 over that of Figures 1 and 2 is that no wiping or moving connections are required and consequently erratic operation which might be the result of such wiping or moving contacts is not encountered.

Figure 8 shows a cross-sectional view of the device of Figure 7 taken along the line 8—8. If desired, an additional plate 56 may be arranged with insulation 58 between the stator plates 40 and 56 and with the rotor vane 54 interleaving the stator plates in its motion. Screws such as 59 may hold the structure together and connect the corresponding parts of the stator and inductor members if there are a plurality of them. In such case, it is of course preferable that the entire device be symmetrically constructed. It is not, of course, necessary to use a plurality of stator parts, and as will be understood by those skilled in the art, the device may be constructed only of the stator plates 40, 42, the inductive conductors 44, 48 and the single pair of rotor vanes 52 and 54 connected and held in place as shown.

With the tuning units described above, I have found that certain types of lattice networks of great utility may be constructed. One of these types of lattice network is illustrated in Figure 10 which may be constructed from the device of Figures 1 and 2. The unit illustrated in Figure 2 is connected in a two-wire transmission unit having terminals T–1 and T–2 at the ends of the transmission line portion leading to the lattice network and terminals T–3 and T–4 at the end leading away from the network. As the network is symmetrical, linear, and passive, it is immaterial which pair of terminals T–1, T–2 or T–3, T–4 are used as the input and output terminals. Terminal A of Figure 2 is connected to terminal T–1 and junction D indicated in Figure 2 between inductor 22 and sectorial plate 24 is connected to terminal T–4. Terminal B is connected to terminal T–2. The equivalent inductance L1 and C1 are indicated on Figure 10. A second tuning unit similar to the unit of Figure 2 is similarly connected with the terminal A′ thereof corresponding to the terminal A and with terminals B′ and D′ thereof corresponding to the terminals B and D of the device of Figure 2 connected respectively to the line terminals T–2 and T–4. The inductance L′1 and C′1 corresponding to the inductance and capacitance respectively L1 and C1 are similarly indicated in Figure 10. This lattice network is well known in network theory and is an all pass network providing a 180 degree phase shift at a critical frequency. The image impedance of the network is the geometric mean of the series and lattice arm impedances. Assuming that L1 and L′1 each are equal to the same value L of inductance and that C1 and C′1 are each equal to the same value C of capacitance, the image impedance becomes $$Z_{im}=\sqrt{\frac{j\omega L}{j\omega C}}$$

where $\omega$ is the angular frequency and $j$ is the imaginary unit. Therefore $$Z_{im} \text{ equals } \sqrt{\frac{L}{C}}$$

which is independent of the frequency. The hyperbolic tangent of the image transfer constant is $$\tanh\frac{\theta}{2}=j\frac{\omega}{\omega_r}=j\omega LC$$

where $$\omega_r^2=\frac{1}{LC}$$

Thus there is provided a phase characteristic equalizer. The equalizer may be arranged to maintain a constant image impedance, even though the phase shift occurs at different tuned frequencies, by ganging the rotors of the two devices so that the rotor elements each provide maximum capacitance and inductance or minimum capacitance and inductance simultaneously. In fact, a single rotor shaft may be used.

Figures 11 and 12 show networks of similar advantage in which the points A–1, D–1, B–1 and D–2 indicated in Figures 6 and 7 are connected in circuit between the line terminals T–1, T–2, T–3, T–4 as indicated in a self-explanatory manner in Figures 11 and 12, with the similar terminals of devices similar to that of Figures 6 and 7 indicated by primes; and the capacities and inductances of the device of Figures 6 and 7 as shown in Figure 9 being indicated in Figures 11 and 12 together with those of the similar devices being indicated by prime reference numerals. It is apparent that if the devices utilized in the networks of Figures 11 and 12 are properly ganged, for example, arranged on a common shaft each to reach maximum or minimum capacity and inductance together, that they will provide constant L to C ratios and constant image impedances.

It should be noted that the generally annular conductors 22, 44, 48, need not, necessarily, lie strictly in the plane of the various sectorial plates of their respective units. They may be spatially curved somewhat in or out, as viewed in Figures 1, 2, 6, or 7, as long as they lie closely adjacent to and spaced from the path of the outer rotor edge.

It will be apparent that the invention provides a novel tuning unit capable of being readily connected in a series tuned circuit at ultra-high-frequencies and which, in its preferred forms, avoids wiping contacts and gives a substantially constant L to C ratio throughout its tuning range. It will be further apparent that the invention provides in practical form a phase shift network of constant image impedance but tunable to provide 180 degrees phase shifts at critical frequencies to which the units may be tuned over a broad range of frequencies.

What I claim is:

1. In combination with two pairs of terminals of a four terminal network, a pair of units each comprising at least one set of elements one of which is a generally sectorial metallic plate and the other of which is a portion of a generally annular inductive conductor enclosing a generally sectorial space and having one end connected to and continuing from a peripheral portion of said plate substantially in the plane thereof and the other end of which is free, a metallic member movable to positions of maximum capacity with said plate and maximum inductance with said annular conductor, intercepting the magnetic lines of force around said annular conductor, and mechanical means to relatively move said member with respect to said set of elements and to space said member therefrom, said member in one position being in said maximum capacitive relation to said plate and in another position in said maximum inductive relation to said conductor and movable to intermediate positions, the respective said peripheral portions of said plate of each pair of units, each being directly connected respectively to one terminal of one pair of terminals, each of the respective said free ends of the annular conductor and said movable members of said pair of units being directly connected together and respectively to one of the other of said pairs of terminals, and mechanical means connecting said movable members for ganged mechanical motion, thereby comprising a symmetrical, linear, and passive network between said two pairs of terminals for passing all frequencies and providing a 180 degree phase shift at a critical frequency dependent upon the position of said movable member.

2. In combination with two pairs of terminals of a four terminal network, a pair of units each comprising a semi-circularly edged capacitor stator and a semi-circularly edged inductive conductor having one end connected to said stator at the periphery thereof and having one end free with respect to said stator, the said semi-circular edges of each unit thereby forming a nearly complete circle, and a metallic rotor member rotatable about an axis through the center of each said circle and normal to the plane thereof, said rotor having a portion in one position in capacitive relation to said stator and in another position in inductive relation to said inductive conductor and movable to positions intermediate said two positions, each of the points of connection between said stators and conductors being directly connected respectively to one of the said pairs of terminals, each of said free ends of said inductors and the said rotors being directly connected respectively to the other of said pairs of terminals, and mechanical means for ganging the movement of said rotors.

3. In combination with two pairs of terminals of a four terminal network, a pair of units each comprising two sets of elements one of each set being a generally quadrantal metallic plate and the other element of each set being a quadrantal portion of a generally annular inductive conductor enclosing a generally quadrantal space and having one end connected to and extending from a peripheral portion of said plate and the other end of which is free, mechanical rotating means including a rotor plate having generally quadrantal diametrically opposed vanes rotating about an axis normal to a single plane in which said elements lie, said plate having one position in capacitive relation to said plates and another position in inductive relation to said conductor and rotatable to intermediate positions, each of the points of connection of said annular conductors to said metallic plates being connected respectively to each of said terminals, the free ends of the annular conductors of one unit being connected respectively to the free ends of the annular conductors of the other unit, and mechanical means ganging the movement of said rotating means.

4. The combination claimed in claim 3, the said free ends being connected to place the said inductive conductors in series between the connected pairs of terminals and the capacities between plates and rotors in shunt across the connected pairs of terminals.

5. The combination claimed in claim 3, the said free ends being connected to place the said conductors in shunt across the connected pairs of terminals and the capacities between plates and rotors in series between the connected pairs of terminals.

GEORGE C. SZIKLAI.

REFERENCES CITED

The following references are of record in the file of this patent:

UNITED STATES PATENTS

| Number | Name | Date |
|---|---|---|
| 2,306,282 | Samuel | Dec. 22, 1942 |
| 2,367,681 | Karplus et al. | Jan. 23, 1945 |
| 2,395,520 | Toth | Feb. 26, 1946 |
| 2,471,705 | Schmitt | May 31, 1949 |

OTHER REFERENCES

"Radio Craft" for June 1945, "Tuning on the U. H. F.," page 560. Copy in Scientific Library, Print in 250–40Z.